US010453876B2

(12) United States Patent
Nodera et al.

(10) Patent No.: US 10,453,876 B2
(45) Date of Patent: Oct. 22, 2019

(54) METHOD FOR MANUFACTURING THIN FILM TRANSISTOR AND DISPLAY PANEL

(71) Applicant: Sakai Display Products Corporation, Sakai-shi, Osaka (JP)

(72) Inventors: Nobutake Nodera, Sakai (JP); Shigeru Ishida, Sakai (JP); Ryohei Takakura, Sakai (JP); Yoshiaki Matsushima, Sakai (JP); Takao Matsumoto, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 15 days.

(21) Appl. No.: 15/567,518

(22) PCT Filed: Apr. 20, 2015

(86) PCT No.: PCT/JP2015/061991
§ 371 (c)(1),
(2) Date: Oct. 18, 2017

(87) PCT Pub. No.: WO2016/170571
PCT Pub. Date: Oct. 27, 2016

(65) Prior Publication Data
US 2018/0122839 A1 May 3, 2018

(51) Int. Cl.
*H01L 29/786* (2006.01)
*H01L 23/544* (2006.01)
(Continued)

(52) U.S. Cl.
CPC .... *H01L 27/1274* (2013.01); *H01L 21/02422* (2013.01); *H01L 21/02532* (2013.01);
(Continued)

(58) Field of Classification Search
CPC ... H01L 27/1214–1296; H01L 27/3241–3297; H01L 29/78651–78678;
(Continued)

(56) References Cited

U.S. PATENT DOCUMENTS 6,964,831 B2 * 11/2005 Lin .......................... G03F 9/708
430/22
7,279,383 B2 * 10/2007 You ....................... G02F 1/136277
438/254
(Continued)

FOREIGN PATENT DOCUMENTS

JP 2005051208 A 2/2005
JP 2011003778 A 1/2011
(Continued)

*Primary Examiner* — Eric A. Ward
(74) *Attorney, Agent, or Firm* — Bret E. Field; Bozicevic, Field & Francis LLP

(57) ABSTRACT

In the present invention, a gate electrode is formed on a substrate surface, and an insulation film is formed on the substrate surface whereon the gate electrode has been formed. A first amorphous silicon layer is formed on the substrate surface whereon the insulation film has been formed. An energy beam is irradiated onto a plurality of required sites spaced from each other in the first amorphous silicon layer to transform each of the required sites into a polysilicon layer. Each of the required sites is situated on the upper side of the gate electrode and serves as a channel region between a source and a drain. This allows other sites, which are in the first amorphous silicon layer and related to the plurality of required sites, to also be irradiated by the energy beam and ablated so as to form at the other sites a cleared portion having a required shape. Thereafter, when a metal layer for the source electrode and the drain electrode is formed, the shape of the cleared portion, which is a recessed portion, is followed, thereby forming a depression in the metal layer. Consequently, the depression is used as an (Continued)

alignment mark, and the source electrode and the drain electrode are formed at appropriate positions on the upper side of the channel region.

4 Claims, 16 Drawing Sheets

(51) Int. Cl.
*H01L 27/12* (2006.01)
*H01L 21/02* (2006.01)
*H01L 29/66* (2006.01)

(52) U.S. Cl.
CPC .. *H01L 21/02592* (2013.01); *H01L 21/02678* (2013.01); *H01L 23/544* (2013.01); *H01L 27/1229* (2013.01); *H01L 27/1288* (2013.01); *H01L 29/66765* (2013.01); *H01L 29/786* (2013.01); *H01L 29/78609* (2013.01); *H01L 29/78618* (2013.01); *H01L 29/78669* (2013.01); *H01L 29/78678* (2013.01); *H01L 2223/5442* (2013.01); *H01L 2223/54426* (2013.01); *H01L 2223/54453* (2013.01)

(58) Field of Classification Search
CPC ......... H01L 21/02422; H01L 21/02532; H01L 21/02592; H01L 21/02678; H01L 23/544; H01L 29/66765; H01L 29/786; H01L 29/78609; H01L 29/78618; H01L 2223/5442; H01L 2223/54426; H01L 2223/54453; H01L 21/2026; G02F 1/1362–1368
See application file for complete search history.

(56) References Cited

U.S. PATENT DOCUMENTS

| | | | |
|---|---|---|---|
| 7,288,792 B2* | 10/2007 | Yudasaka | H01L 27/12 257/59 |
| 7,728,256 B2* | 6/2010 | Jung | B23K 26/0823 219/121.82 |
| 8,258,510 B2* | 9/2012 | Kim | H01L 27/1229 257/57 |
| 2005/0012228 A1 | 1/2005 | Hiramatsu et al. | |
| 2009/0050896 A1 | 2/2009 | Kaitoh et al. | |
| 2010/0320468 A1 | 12/2010 | Kamata et al. | |
| 2016/0218123 A1* | 7/2016 | Moon | H01L 27/1262 |

FOREIGN PATENT DOCUMENTS

| | | |
|---|---|---|
| JP | 2011029411 A | 2/2011 |
| JP | 5226259 B2 | 7/2013 |

* cited by examiner

METHOD FOR MANUFACTURING THIN FILM TRANSISTOR AND DISPLAY PANEL

This application is the national phase under 35 U.S.C. § 371 of PCT International Application No. PCT/JP2015/061991 which has an International filing date of Apr. 20, 2015 and designated the United States of America.

BACKGROUND

Technical Field

The present invention relates to a method for manufacturing a thin film transistor and a display panel including the thin film transistor.

Description of Related Art

A thin film transistor (TFT) type liquid crystal display includes a TFT substrate and a color filter substrate having red (R), green (G) and blue (B) colors, in which the TFT substrate and the color filter substrate are stuck to each other with a required gap, and liquid crystal is injected therebetween, and may display an image by controlling transmittance of light in liquid crystal molecules for each pixel.

In the TFT substrate, data lines (source bus lines) and scanning lines (gate bus lines) are wired in a lattice shape in longitudinal and lateral directions, and pixels including the TFTs are formed at places in which the data lines and the scanning lines intersect with each other. In addition, a driving circuit, which includes the TFTs and drives the data lines and the scanning lines, is formed around a display region including a plurality of pixels.

There are two types of TFTs, an amorphous silicon (a-Si) TFT in an amorphous state and a polycrystalline silicon (p-Si) TFT in a polycrystalline state depending on the crystalline state of a semiconductor (silicon). The a-Si TFT has a high resistance and a low leakage current (leak current).

In addition, the p-Si TFT has considerably higher mobility of electrons than that of the a-Si TFT. For this reason, the a-Si TFT having the low leakage current is used for each pixel included in the display region, and the p-Si TFT having the higher mobility of electrons is used for the driving circuit.

Further, from a structure viewpoint of the TFT, generally, the a-Si TFT uses a bottom gate structure in which a gate electrode is disposed in the lowermost layer, and the p-Si TFT uses a top gate structure in which the gate electrode is disposed above a semiconductor film.

Meanwhile, in Japanese Patent Publication No. 5226259, a liquid crystal display device having a structure in which, in the TFT of the bottom gate structure, an a-Si layer is formed so as to cover a p-Si layer to prevent the p-Si layer from directly contacting with a source electrode and a drain electrode, is disclosed.

SUMMARY

Generally, in manufacturing of the above described bottom gate type TFT, a specific pattern (alignment mark) is used in a case of processing such as forming a so-called channel region, forming the source electrode and the drain electrode or the like. That is, a position of each processing is determined based on a position of the alignment mark, thereby resulting in positioning (hereinafter, referred to as an alignment) between the structures of each layer in such a laminating direction. In addition, conventionally, the alignment mark is formed in a process of forming the gate electrode, which is an initial process of manufacturing the bottom gate type TFT.

However, therefore, unevenness in precision of the alignment occur. For example, the process of forming the channel region after the process of forming the gate electrode is performed using the already formed alignment mark, but commonly, misregistration in a certain range occurs. Thereafter, in a process of forming the source electrode and the drain electrode after a plurality of layers are formed, the alignment mark is covered with the plurality of layers, whereby it difficult to recognize the alignment mark, and further, a misregistration in a certain range occurs. Furthermore, the misregistration in the alignment is repeated again as described above, such that unevenness occurs in a performance of the manufactured bottom gate type TFT.

In consideration of the above mentioned circumstances, it is an object of the present invention to provide a method for manufacturing a thin film transistor which are capable of reducing the misregistration in the alignment and suppressing the unevenness in precision, and a display panel including the thin film transistor.

According to one embodiment of the present invention, there is provided a method for manufacturing a thin film transistor which comprises the processes of forming a gate electrode on a surface of a substrate; forming an insulation film on the surface of the substrate on which the gate electrode is formed; forming a first amorphous silicon layer on the surface of the substrate on which the insulation film is formed; annealing a plurality of required places separated from each other in the first amorphous silicon layer by irradiating the required places with an energy beam to be changed to a polysilicon layer; during the annealing process, forming removed parts having a required shape at other places in association with the plurality of required places by irradiating the other places with the energy beam; forming a second amorphous silicon layer so as to cover the polysilicon layer; forming an n+ silicon layer on a surface of the second amorphous silicon layer; forming a required pattern at the n+ silicon layer; etching the first amorphous silicon layer, the second amorphous silicon layer and the n+ silicon layer; forming a metal layer on the n+ silicon layer etched; and during forming the metal layer, forming source electrodes and drain electrodes based on positions of concaves formed due to the removed parts.

According to the embodiment of the present invention, the gate electrode is formed on the surface of the substrate, and the insulation film is formed on the surface of the substrate on which the gate electrode has been formed. The first amorphous silicon layer (an a-Si film) is formed on the surface of the substrate on which the insulation film has been formed. In the annealing process, by irradiating the plurality of required places separated from each other in the first amorphous silicon layer with an energy beam, the required places are changed to a polysilicon layer (a poly-Si film). Each of the required places is a channel region above the gate electrode, between a source and a drain. For the energy beam, it is possible to use, for example, an excimer laser of ultraviolet light which is largely absorbed by the amorphous silicon layer (a-Si film). A laser beam from a laser beam source is made incident on, for example, a multi-lens array, and thereby the laser beam is partially irradiated to each required place via different optical paths for each lens. Thereby, in the first amorphous silicon layer, only regions (the plurality of required places separated from each other)

to be the channel region are selectively changed to the polysilicon layer (poly-Si film).

The removed part forming process is performed together with the annealing process. That is, during the annealing process, other places, which are in the first amorphous silicon layer and are in association with the plurality of required places, are also irradiated with the energy beam to be ablated. Herein, ablation means that a high energy is applied to the amorphous silicon layer, and silicon is evaporated so as to be cut out. As a result, the removed part having a required shape is formed at the other places, and the removed part functions as an alignment mark as described below.

The second amorphous silicon layer is formed so as to cover the polysilicon layer formed by the annealing process, and the n+ silicon layer is formed on the surface of the second amorphous silicon layer. The n+ silicon layer (an n+ Si film) is a contact layer with the source electrode and the drain electrode, and is a semiconductor layer having a high impurity concentration such as phosphorus or arsenic. Then, the required pattern is formed on the n+ silicon layer. The required pattern may be appropriately determined according to an arrangement or structure of the source electrode, the drain electrode and the semiconductor layer. Next, the first amorphous silicon layer, the second amorphous silicon layer and the n+ silicon layer are etched in order to obtain a required structure and the source electrode and the drain electrode are formed on the n++ silicon layer having been etched.

That is, the metal layer is formed on the n+ silicon layer after the etching, and patterning processing is executed on the metal layer to form the source electrode and the drain electrode. At this time, the formation of the metal layer is also performed on the removed part, and the concave having a shape copying the removed part that is a recessed part is formed. In addition, since the removed part is associated with the plurality of required places (channel regions), the position of the channel region may be specified from the position of the concave. Therefore, by using the concave as the alignment mark, the source electrode and the drain electrode may be formed at appropriate positions above the channel region.

As compared to a case in which, after the amorphous silicon layer formed above the whole of the substrate surface is changed to the polysilicon layer by irradiating the entire surface of the substrate with an energy beam (for example, laser), each process of exposure, development and etching processings is performed on the polysilicon layer to form the channel region, according to the above-described manufacturing method, the entire surface of the substrate is not irradiated with the energy beam (for example, laser), but, in the first amorphous silicon layer, only the regions to be the channel region are partially irradiated with the energy beam, such that it is possible to form the channel region only by the annealing process. Therefore, each process of the exposure, the development and the etching processings for forming the channel region is not required, and the manufacturing process may be shortened.

Further, since the source electrode and the drain electrode are formed above the channel region by using the removed part formed during the forming the channel region (annealing process) as the alignment mark, misregistration therebetween in a direction in which these layers are laminated may be suppressed as much as possible.

In the method for manufacturing the thin film transistor according to the embodiment of the present invention, the annealing process and the removed part forming process may be simultaneously performed using a halftone mask having a plurality of transmissive parts with different transmittances from each other.

According to the embodiment of the present invention, the annealing process and the removed part forming process are simultaneously performed. In addition, in the annealing process and the removed part forming process, the halftone mask is used, and forming of the channel region by crystallization and forming of the removed part by ablation are simultaneously performed even if an energy beam with the same magnitude is used.

In the method for manufacturing the thin film transistor according to the embodiment of the present invention, the concaves may be formed in the vicinity of the plurality of required places, above a gate bus line connected with the gate electrode.

According to the embodiment of the present invention, since the plurality of the concaves are associated with the plurality of required places (channel regions), the position of the channel region may be specified from the position of the concave. In addition, the concave (removed part) is formed in the vicinity of the plurality of required places, above the gate bus line connected with the gate electrode so as not to overlap with a source bus line. That is, since the concave is located near the channel region, the concave may function more effectively as the alignment mark.

According to one embodiment of the present invention, there is provided a thin film transistor which comprises a gate electrode formed on a surface of a substrate; a polysilicon layer formed above the gate electrode; an amorphous silicon layer and an n+ silicon layer formed above the polysilicon layer; a source electrode and a drain electrode formed by patterning a metal layer formed on the n+ silicon layer; and a concave which is formed in the metal layer to represent a position relating to the patterning.

According to the embodiment of the present invention, the thin film transistor includes: the gate electrode formed on the surface of the substrate; the polysilicon layer (poly-Si film) formed above the gate electrode; the amorphous silicon layer (a-Si film) and the n+ silicon layer (n+ Si film) formed above the polysilicon layer; and the source electrode and the drain electrode formed on the n+ silicon layer. The polysilicon layer is the channel region. In addition, the n+ silicon layer is a contact layer with the source electrode and the drain electrode, and is a semiconductor layer having a high impurity concentration such as phosphorus or arsenic.

In addition, the source electrode and the drain electrode are formed by patterning the metal layer formed on the n+ silicon layer, and the concave is formed in the metal layer. Since the concave represents the position relating to the patterning, for example, the position of the channel region, the concave is used as the alignment mark.

In the a thin film transistor according to the embodiment of the present invention, the concave may be formed in the vicinity of the gate electrode, above a gate bus line connected with the gate electrode.

According to the embodiment of the present invention, the concave is formed in the vicinity of the gate electrode, above the gate bus line connected with the gate electrode, so as not to overlap with the source bus line. That is, since the concave is located near the channel region, the concave may function more effectively as the alignment mark.

In the a thin film transistor according to the embodiment of the present invention, it is preferred that the amorphous silicon layer includes a first amorphous silicon layer which is formed around the polysilicon layer and has a thickness approximately equal to the thickness of the polysilicon layer and a second amorphous silicon layer formed on surfaces of the polysilicon layer and the first amorphous silicon layer.

According to the embodiment of the present invention, the amorphous silicon layer includes: the first amorphous silicon layer which is formed around the polysilicon layer and has the thickness approximately equal to the thickness of the polysilicon layer; and the second amorphous silicon layer formed on the surfaces of the polysilicon layer and the first amorphous silicon layer. That is, the polysilicon layer is obtained in such a way that, in the first amorphous silicon layer formed above the gate electrode, only a region corresponding to the channel region is changed to the polysilicon layer which is the polycrystalline state. Therefore, it is obvious that each processing of exposure, development and etching processings for forming the channel region is not performed. Further, since the second amorphous silicon layer is provided so as to prevent the source and drain electrodes from directly contacting with the channel region, the feature of having a low leakage current (leak current) is used.

According to one embodiment of the present invention, there is provided a display panel comprising the thin film transistor according to the above-described invention.

According to the embodiment of the present invention, it is possible to provide a display panel capable of shortening a manufacturing process.

Advantageous Effects

According to the embodiment of the present invention, it is possible to reduce the misregistration in the alignment to suppress the unevenness in precision, and stabilize a performance of the manufactured bottom gate type TFT.

The above and further objects and features will move fully be apparent from the following detailed description with accompanying drawings.

DETAILED DESCRIPTION

Figure 1:
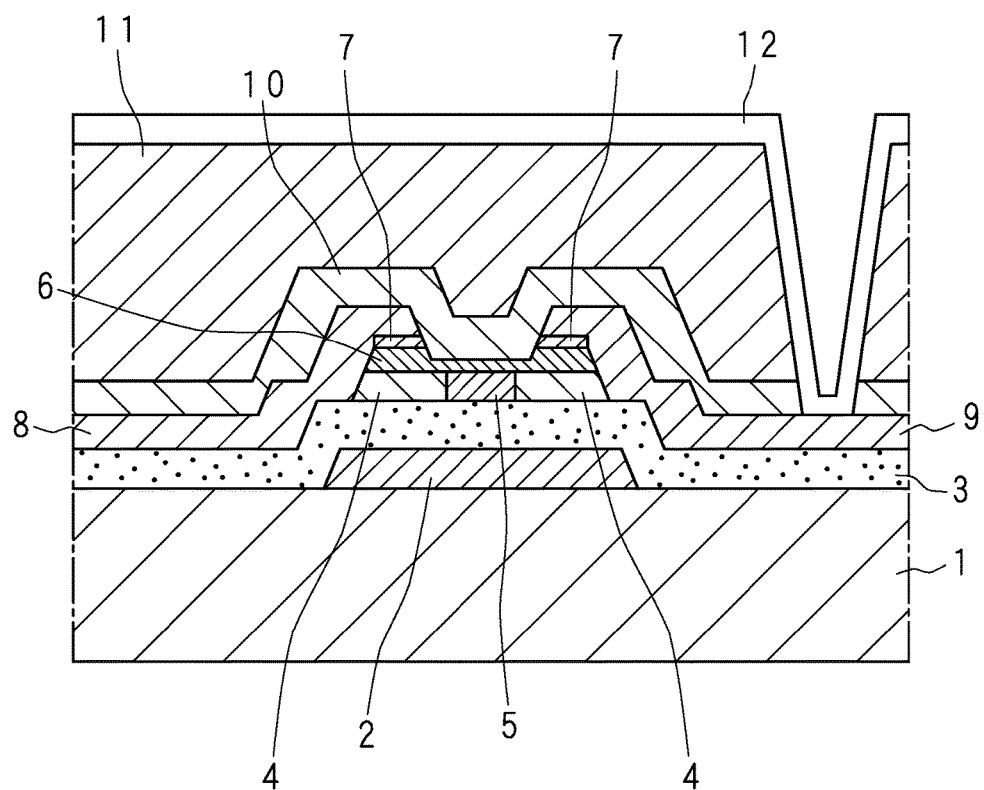
FIG. 1 is a schematic cross-sectional view of main components illustrating a first example of a structure of a bottom gate type thin film transistor according to the present embodiment.

Hereinafter, embodiments of the present invention will be described with reference to the accompanying drawings illustrating the embodiments thereof. FIG. 1 is a schematic cross-sectional view of main components illustrating a first example of a structure of a bottom gate type thin film transistor according to the present embodiment. As illustrated in FIG. 1, the thin film transistor (also referred to as a TFT substrate) 100 includes a gate electrode 2 formed on a surface of a glass substrate 1 (hereinafter, also referred to as a substrate), and a gate insulation film 3 (for example, an $SiO_2$ film, $SiO_2$/SiN film laminate, SiN film, SiON film, or the like) formed so as to cover the gate electrode 2.

A polysilicon layer (poly-Si film) 5 is formed on a surface of the gate insulation film 3 and above the gate electrode 2. Herein, the polysilicon layer also includes microcrystals having a relatively smaller crystal grain size than polycrystals, or single crystals having a larger grain size. A first amorphous silicon layer (a-Si film) 4 having a thickness approximately equal to the thickness of the polysilicon layer 5 is formed around the polysilicon layer 5. In addition, a second amorphous silicon layer (a-Si film) 6 is formed on the surfaces of the polysilicon layer 5 and the first amorphous silicon layer 4. Hereinafter, the first amorphous silicon layer 4 and the second amorphous silicon layer 6 are collectively and simply referred to as an amorphous silicon layer.

An n+ silicon layer (n+ Si film) 7 is formed at a required position on the surface of the second amorphous silicon layer 6. The n+ silicon layer 7 is a contact layer with a source electrode 8 and a drain electrode 9, which will be described below, and is a semiconductor layer having a high impurity concentration such as phosphorus or arsenic.

The source electrode 8 and the drain electrode 9 respectively having a required pattern are formed on the surface of the n+ silicon layer 7, side faces of the second amorphous silicon layer 6 and the first amorphous silicon layer 4, and a part of the surface of the gate insulation film 3.

The polysilicon layer 5 corresponds to a channel region. In addition, in the following description, the first amorphous silicon layer 4, the second amorphous silicon layer 6 and the polysilicon layer 5 are also collectively referred to as a semiconductor layer. The TFT including the gate electrode 2, the semiconductor layer, the source electrode 8, the drain electrode 9, and the like illustrated in FIG. 1 shows a TFT for a driving circuit for driving pixels, or a TFT for a pixel. In other words, a method for manufacturing the thin film transistor according to the present embodiment may be applied to both of the TFT for a driving circuit for driving pixels, and the TFT for a pixel. Further, the application of the method for manufacturing the thin film transistor according to the present embodiment is not limited thereto.

A passivation film 10 made of, for example, SiN is formed on the entire TFT substrate so as to cover the source electrode 8 and the drain electrode 9, and an organic film 11 is formed on a surface of the passivation film 10 to flatten the surface thereof. Through holes are formed at required positions of the passivation film 10 and the organic film 11 so that a pixel electrode 12 and the drain electrode 9 (and the source electrode 8) conduct with each other through the through holes. The pixel electrode 12 is made of, for example, ITO which is a transparent conductive film.

In the above-described bottom gate type TFT, since the polysilicon layer 5 has a thickness approximately equal to the thickness of the first amorphous silicon layer 4 around thereof, the polysilicon layer 5 is obtained in such a way that, in the first amorphous silicon layer 4 formed above the gate electrode 2, only regions corresponding to the channel region (a plurality of required places separated from each other) are changed to the polysilicon layer 5 which is a polycrystalline state by annealing treatment using an energy beam (for example, a laser). Therefore, it is obvious that each processing of exposure, development and etching processings for forming the polysilicon layer 5 as the channel region is not performed.

In addition, since the polysilicon layer 5 is formed by partial laser annealing to be described below, a boundary surface between the polysilicon layer 5 and the first amorphous silicon layer 4 is substantially perpendicular to the surface of the substrate 1. That is, if the polysilicon layer 5 is formed by conventional photo etching, the side face of the polysilicon layer 5 does not become substantially perpendicular to the surface of the substrate 1, but becomes a taper shape to be wider toward the gate electrode 2. On the other hand, if the polysilicon layer 5 is formed by laser annealing as in the present embodiment, a line width of the polysilicon layer 5 proximal to the gate electrode 2 is not wider than the line width thereof proximal to the source electrode 8 and the drain electrode 9 (that is, the line width proximal to the gate electrode 2 and the line width proximal to the source electrode 8 and the drain electrode 9 are approximately equal to each other), such that it is easy to prevent at least one electrode of the source electrode 8 and the drain electrode 9 from being overlapped with the polysilicon layer 5 when they are projected onto the surface of the substrate 1. In addition, since the gate insulation film 3 of the channel region is not exposed to etching, a deterioration in TFT characteristics may be suppressed.

In addition, since the second amorphous silicon layer 6 is provided so as to prevent the source electrode 8 and drain electrode 9 from directly contacting with the channel region, a feature of having a low leakage current (leak current) is used. Accordingly, by using the polysilicon layer 5 as the channel region, an operating speed of the TFT for the driving circuit may be increased, and the second amorphous silicon layer 6 is provided between the polysilicon layer 5 and the source and drain electrodes 8 and 9, such that a decrease in the leakage current may be achieved.

Figure 2:
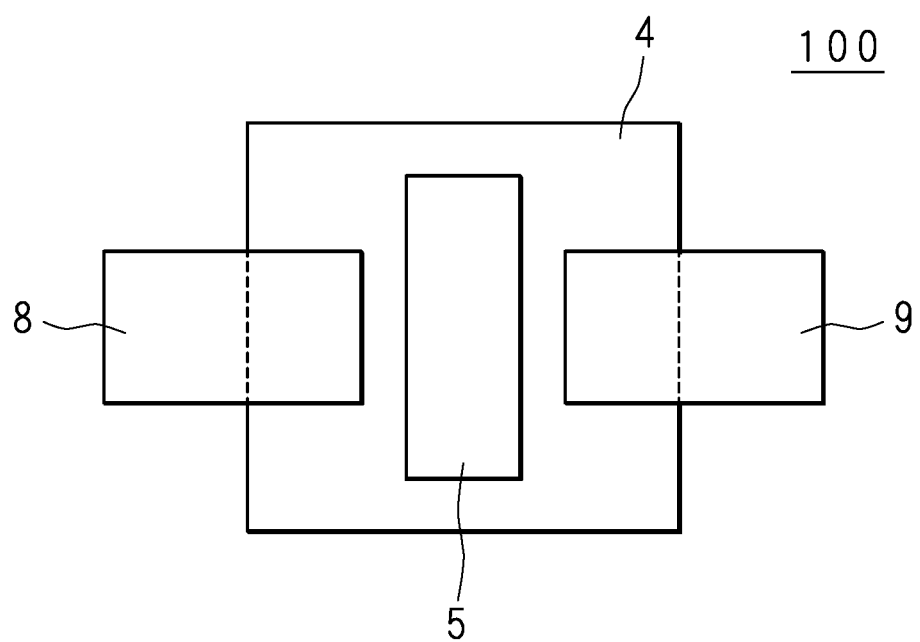
FIG. 2 is a schematic plan view of the main components illustrating the first example of the structure of the thin film transistor according to the present embodiment.

FIG. 2 is a schematic plan view of the main components illustrating the first example of the structure of the thin film transistor 100 according to the present embodiment. FIG. 2 illustrates a positional relationship between the first amorphous silicon layer 4, the polysilicon layer 5, the source electrode 8 and the drain electrode 9 in a plan view for the sake of simplicity. As illustrated in FIG. 2, the first amorphous silicon layer 4 is formed around the polysilicon layer 5. In addition, although not illustrated in the drawing, the second amorphous silicon layer 6 having substantially the same dimension as the dimension (longitudinal and lateral dimensions) of the first amorphous silicon layer 4 is formed on the surfaces of the polysilicon layer 5 and the first amorphous silicon layer 4.

In the first embodiment, the thin film transistor 100 is configured so that positions (hereinafter, referred to as projected positions) where the source electrode 8, the drain electrode 9 and the polysilicon layer 5 (channel region) are projected onto the surface of the glass substrate 1 are not overlapped with each other. More specifically, the polysilicon layer 5 is spaced apart from the source electrode 8 and the drain electrode 9, respectively, by about 1 μm as seen from a direction in which the source electrode 8, the drain electrode 9, and the polysilicon layer 5 are laminated. Thereby, the leakage current between the source and drain electrodes 8 and 9 and the polysilicon layer 5 may be further reduced.

Further, in the method for manufacturing the thin film transistor 100 according to the present embodiment, at the time of the laser annealing, a specific place is ablated to form a removed part, and the removed part is used for positioning (hereinafter, referred to as an alignment) between the structures of respective layers of the thin film transistor 100, which will be described in detail below.

Figure 3:
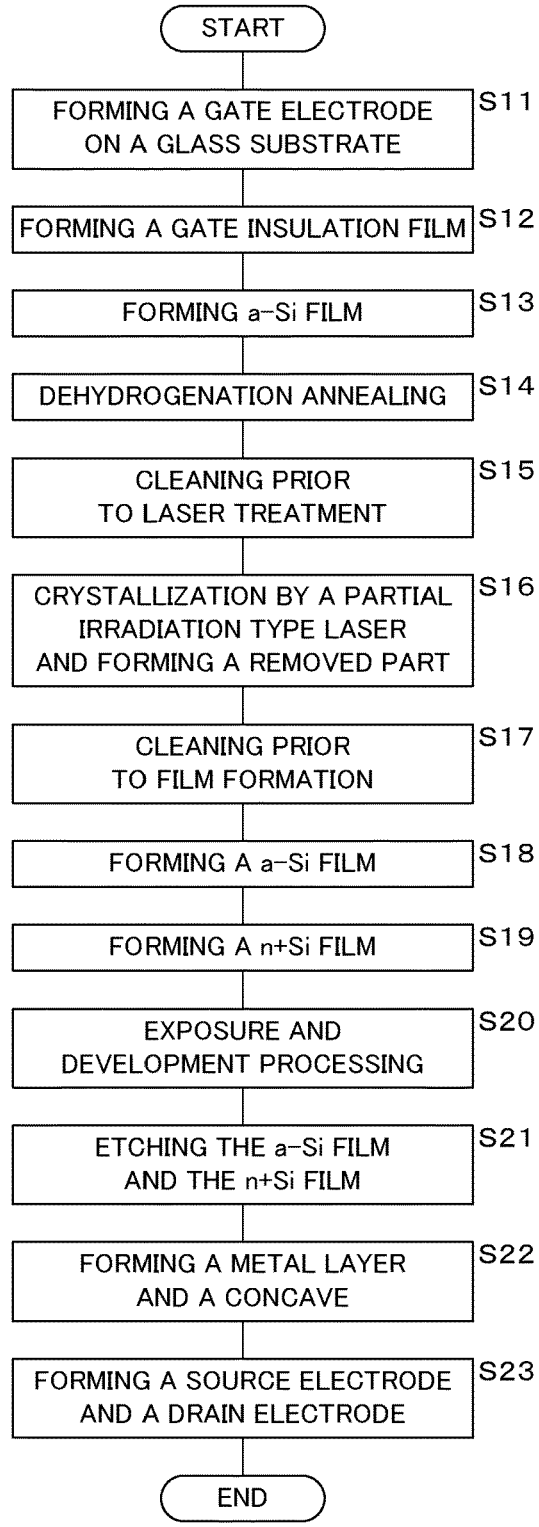
FIG. 3 is a flow chart of manufacturing processes illustrating an example of a method for manufacturing the thin film transistor according to the present embodiment.

FIG. 3 is a flow chart of manufacturing processes illustrating an example of the method for manufacturing the thin film transistor 100 according to the present embodiment. Hereinafter, the manufacturing processes of the thin film transistor 100 of the present embodiment will be described.

First, the gate electrode 2 is formed on the glass substrate 1 by film formation and patterning (S11). At this time, an alignment mark (not illustrated) used for the alignment is formed on a metal for the gate electrode 2.

Next, a gate insulation film 3 is formed on the surface of glass substrate 1 so as to cover the gate electrode 2 (S12). Then, an a-Si film 4 as the first amorphous silicon layer is formed on the surface of the glass substrate 1 on which the gate insulation film 3 has been formed (S13). Thereafter, in order to anneal the a-Si film 4 with laser, dehydrogenation annealing treatment is performed (S14), and cleaning prior to laser treatment is performed (S15).

In addition, partial crystallization of the a-Si film 4 by a partial irradiation type laser using the alignment mark, and formation of the removed part to be described below are simultaneously performed (S16).

The crystallization process is an annealing process (also referred to as a laser annealing process). For example, the required place is changed to the polysilicon layer (poly-Si film) 5 by irradiating the required place of the a-Si film 4 with an energy beam through a multi-lens array. The required place is determined based on the position of the alignment mark, is above the gate electrode 2, and is a channel region between the source and the drain. For the energy beam, it is possible to use, for example, an excimer laser of ultraviolet light which is largely absorbed by the amorphous silicon layer (a-Si film), or a solid-state laser having a wavelength of a green wavelength or less.

Figure 4:
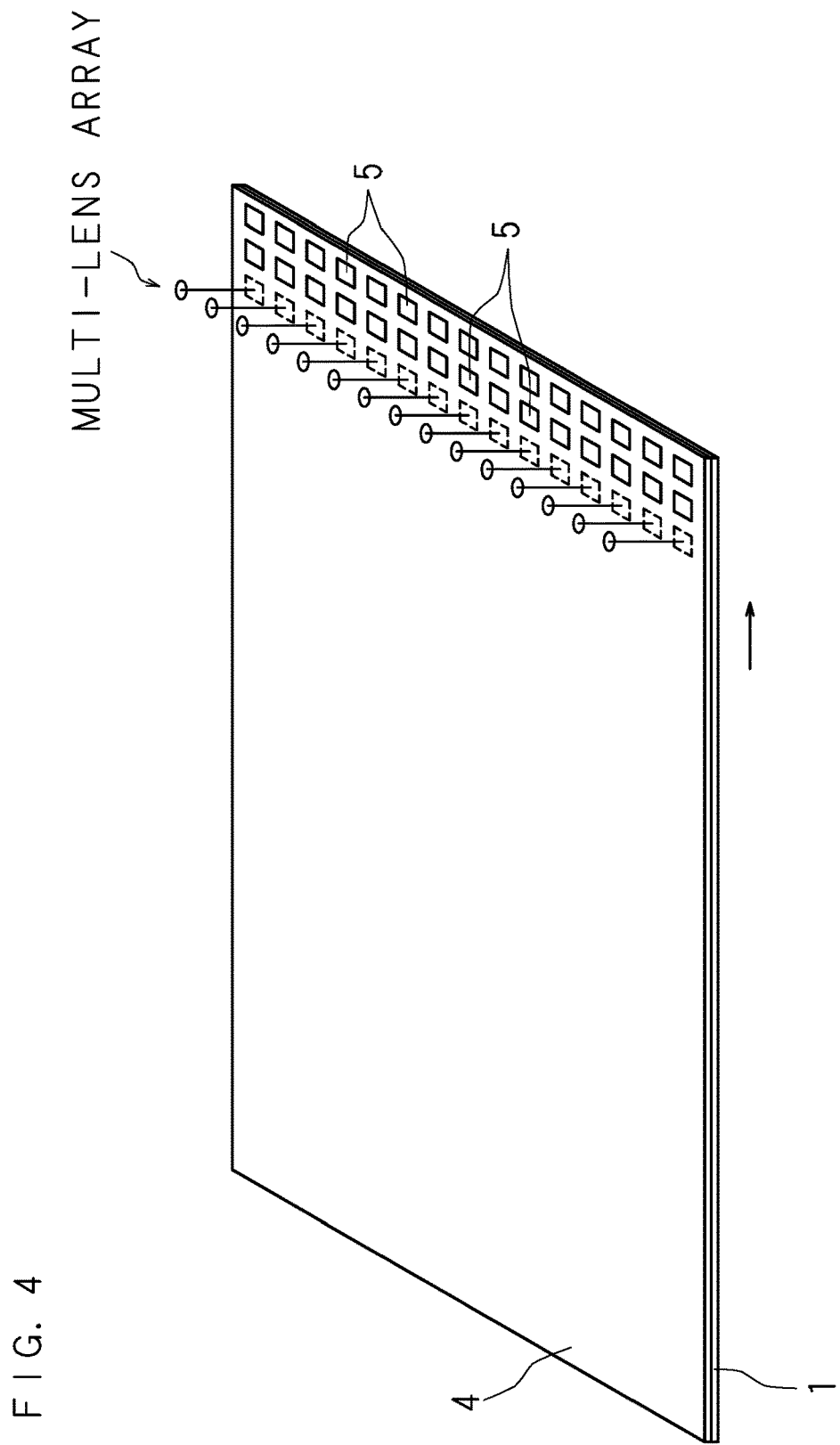
FIG. 4 is a schematic view illustrating an example of a configuration of a partial irradiation type laser according to the present embodiment.

FIG. 4 is a schematic view illustrating an example of a configuration of the partial irradiation type laser according to the present embodiment. As illustrated in FIG. 4, the glass substrate 1 having the a-Si film 4 formed on the surface thereof is placed on a mount table (not illustrated), and is moved parallel to a direction shown by an arrow in FIG. 4 at a required speed. A multi-lens array, in which individual lenses are arranged by appropriately spacing apart from each other in a direction intersecting the moving direction of the glass substrate 1, is disposed above the glass substrate 1. A laser beam from a laser light source (not illustrated) enters the multi-lens array, and thereby the laser beam is partially irradiated to a plurality of required places separated from each other via different optical paths for each lens. That is, the partial laser annealing may be performed. Thereby, in the a-Si film 4, only the required region to be the channel region is selectively changed to the polysilicon layer (poly-Si film) 5.

Figure 5:
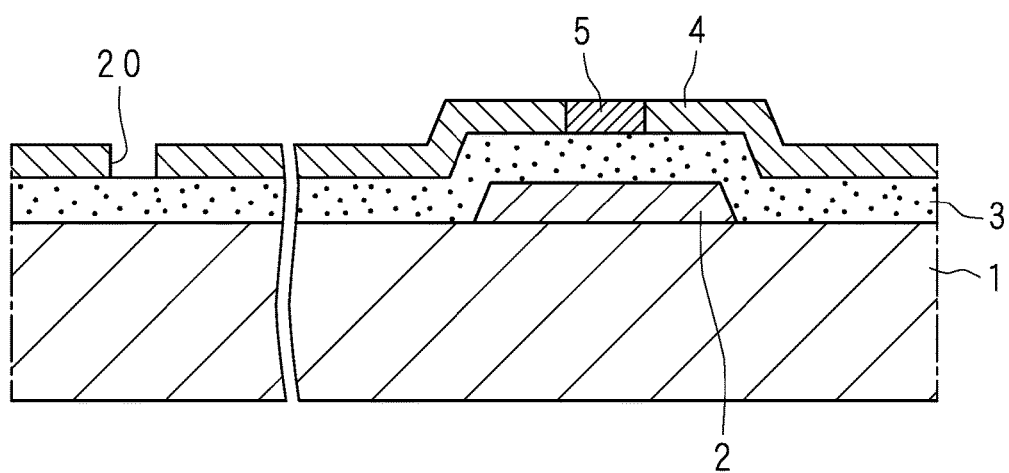
FIG. 5 is an explanatory view describing a formation of a removed part in the method for manufacturing the thin film transistor according to the present embodiment.

During the above-described laser annealing process, the formation of the removed part is also performed. FIG. 5 is an explanatory view describing the formation of the removed part 20 in the method for manufacturing the thin film transistor 100 according to the present embodiment. For example, a halftone mask is used for forming the removed part 20. The halftone mask is a mask which is provided with, in addition to a transmissive part of a laser beam and a light shielding part, for example, a semi-transmissive part having a light transmittance different from that of the transmissive part and a transmittance different from that of the light shielding part. By using such a halftone mask, an amount of exposure to the a-Si film 4 may be made different even with a single exposure. That is, since an intensity of the laser beam can be partially increased or decreased by using a laser beam having the same intensity, it is possible to perform the ablation of the a-Si film 4 together with the crystallization of the a-Si film 4. By such ablation of the a-Si film 4, the removed part 20 is formed in such a place.

Then, cleaning prior to film formation is performed (S17), and so as to cover the polysilicon layer 5 that has been in the polycrystalline state by the annealing process, the a-Si film 6 as the second amorphous silicon layer is formed (S18). Further, the n+ Si film (n+ silicon layer) 7 is formed on the surface of the a-Si film 6 (S19). The n+ Si film 7 is a contact layer with the source electrode 8 and the drain electrode 9, and is a semiconductor layer having a high impurity concentration such as phosphorus or arsenic.

Next, exposure and development processings are performed (S20), and a required pattern is formed on the n+ Si film (n+ silicon layer) 7. The required pattern may be appropriately determined according to an arrangement or structure of the source electrode 8, the drain electrode 9 and the semiconductor layer. Then, in order to make the semiconductor layer have a required structure, the a-Si films 4 and 6 and the n+ Si film 7 are etched (S21).

Thereafter, a metal layer M for the source electrode 8 and the drain electrode 9 is formed on the n+ Si film 7 having been etched by, for example, sputtering, vapor deposition, or the like. At this time, in the metal layer M, a concave having a shape copying the removed part 20 is formed at a position corresponding to the removed part 20 on a lower side of the concave (S22).

Figure 6:
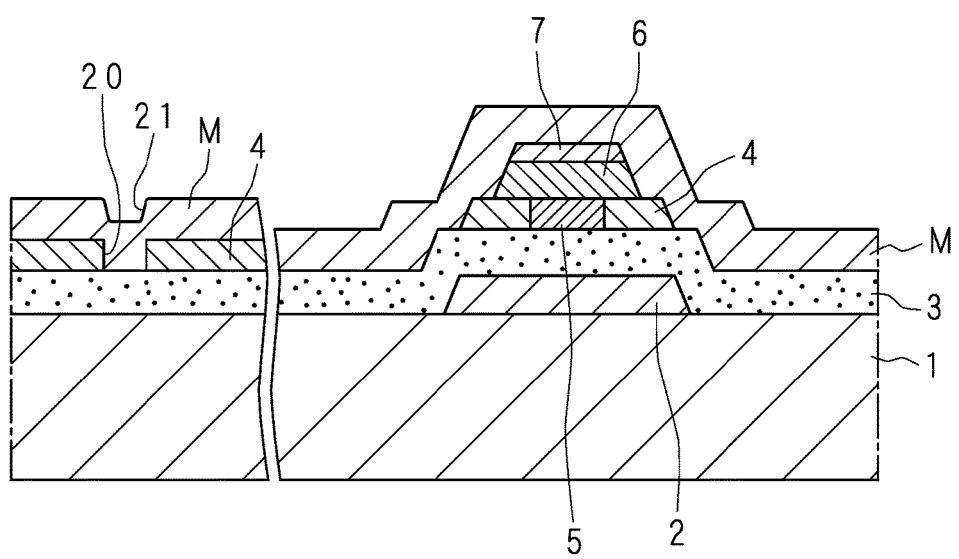
FIG. 6 is an explanatory view describing a formation of a concave in the method for manufacturing the thin film transistor according to the present embodiment.

FIG. 6 is an explanatory view describing the formation of a concave 21 in the method for manufacturing a thin film transistor 100 according to the present embodiment. As illustrated in FIGS. 5 and 6, the removed part 20 is recessed part ablated by the laser beam. Accordingly, when the metal layer M is formed on the n+ Si film 7 having been etched, that is, on the removed part 20, a concave 21 is formed on the removed part 20, and the concave 21 has a shape along the shape of the removed part 20.

That is, it is difficult to recognize the removed part 20 due to being covered by the formation of the metal layer M, but the concave 21 is formed at a position corresponding to the removed part 20 of the metal layer M, and thereby the position and shape of the removed part 20 may be clearly recognized.

Thereafter, using the concave 21 as the alignment mark, the source electrode 8 and the drain electrode 9 are formed by patterning the metal layer M (S23).

Figure 7:
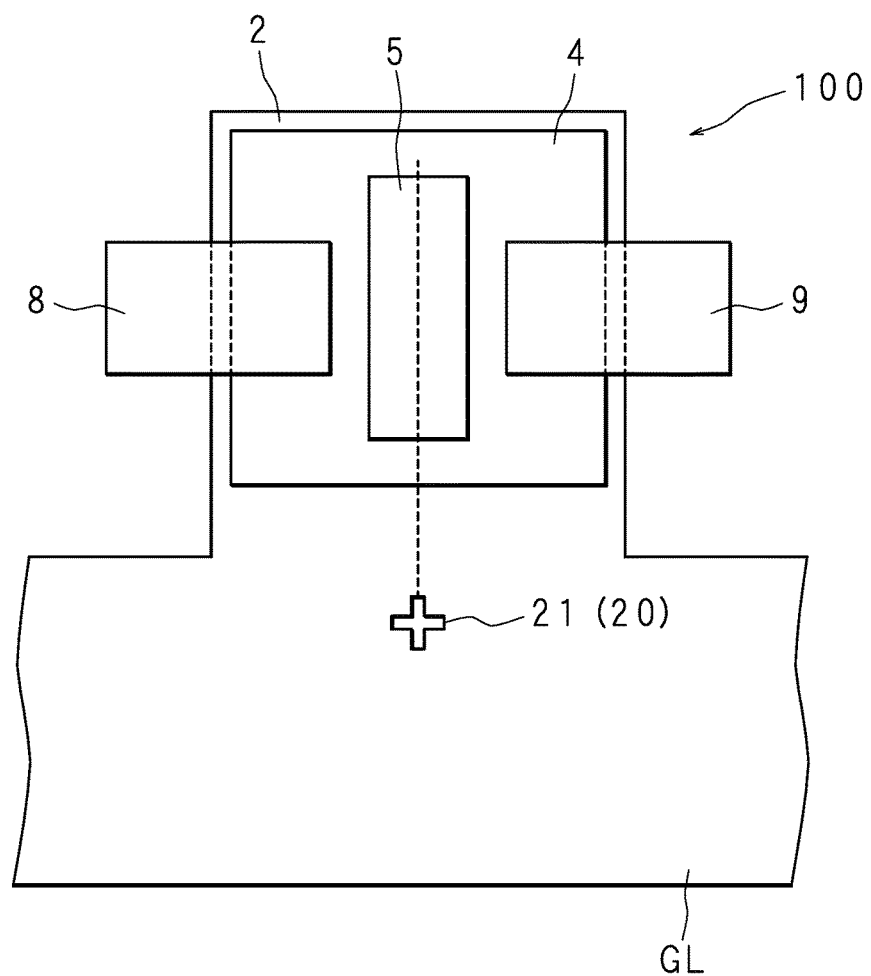
FIG. 7 is an explanatory view describing a position of the concave in the method for manufacturing the thin film transistor according to the present embodiment.

FIG. 7 is an explanatory view describing a position of the concave 21 in the method for manufacturing the thin film transistor 100 according to the present embodiment. Hereinafter, for the convenience of explanation, a case in which the shape of the concave 21 (removed part 20) is a 'cross shape (+)' will be described as an example, but such a shape is not limited thereto.

The concave 21 is formed in the vicinity of the gate electrode 2, on a gate bus line GL connected with the gate electrode 2. More specifically, the concave is formed at a central position of the polysilicon layer 5 in a juxtaposition direction in which the source electrode 8, the polysilicon layer 5 and the drain electrode 9 are juxtaposed, on a line extending in a direction intersecting the juxtaposition direction, and at a position on the gate bus line GL. That is, the position (or shape) of the concave 21 indicates the position of the polysilicon layer 5.

Therefore, it is possible to perform patterning using the concave 21 as the alignment mark so that the projected positions of the source electrode 8, the drain electrode 9 and the polysilicon layer 5 are not overlapped with each other. In other words, the position (or shape) of the concave 21 indicates the position of patterning.

In addition, the forming position of the concave 21 (removed part 20) is not particularly limited. For example, the forming position may be a corner or an edge of the glass substrate 1. Further, when the forming position of the concave 21 (removed part 20) is in the vicinity of the gate electrode 2, the source electrode 8, the drain electrode 9, the polysilicon layer 5, or the like, a precision of the alignment may be further increased. That is, the forming position may be on the gate bus line GL as long as it is not overlapped with the source bus line.

Figure 8:
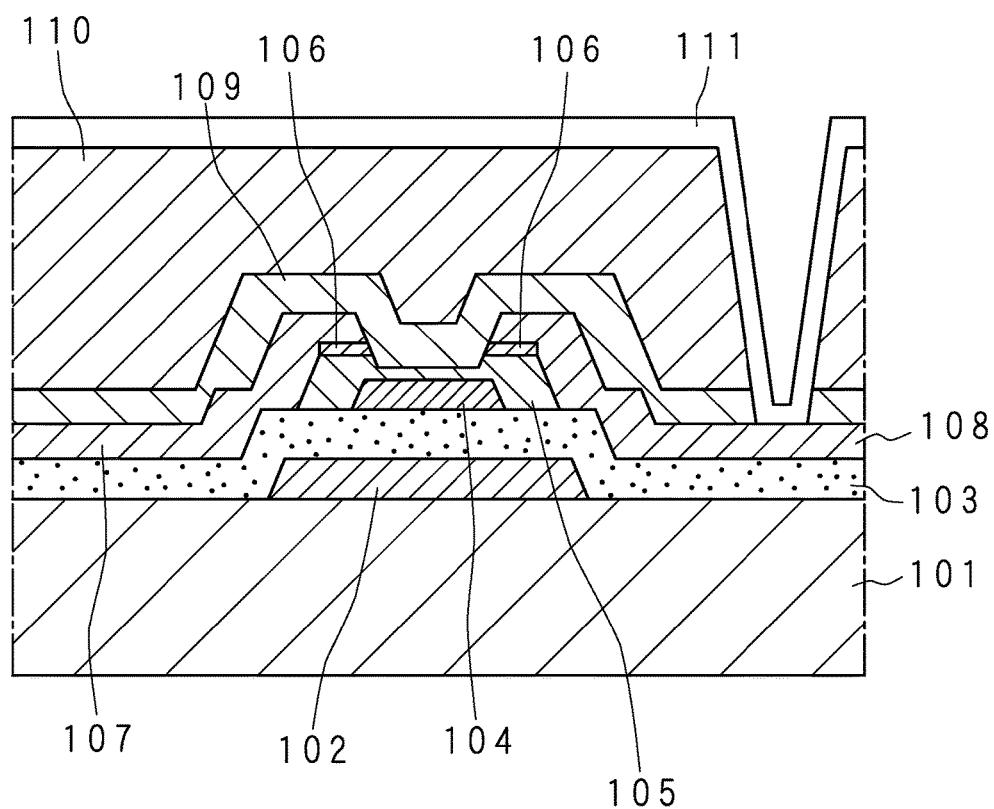
FIG. 8 is a schematic cross-sectional view of main components illustrating a structure of a conventional thin film transistor.
Figure 9:
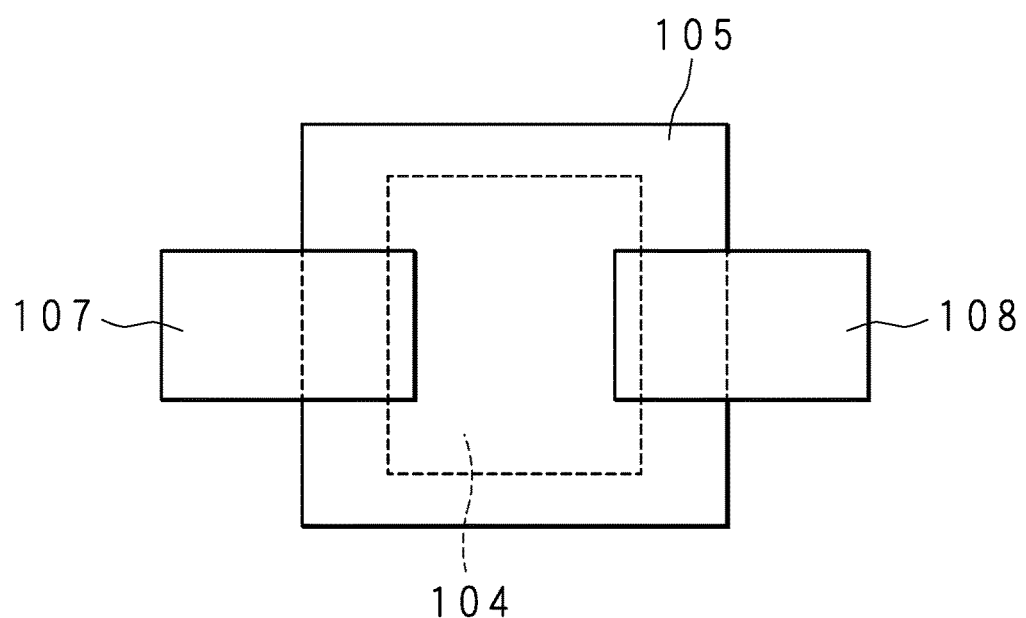
FIG. 9 is a schematic plan view of main components illustrating the structure of the conventional thin film transistor.

Next, the conventional TFT as a comparative example will be described. FIG. 8 is a schematic cross-sectional view of main components illustrating a structure of the conventional thin film transistor, and FIG. 9 is a schematic plan view of main components illustrating the structure of the conventional thin film transistor. The conventional thin film transistor includes a gate electrode 102 formed on the surface of a glass substrate 101, and a gate insulation film 103 formed so as to cover the gate electrode 102. A polysilicon layer (poly-Si film) 104 is formed on the surface of the gate insulation film 103, above the gate electrode 102.

An amorphous silicon layer (a-Si film) 105 is formed on the polysilicon layer 104 so as to cover the same. An n+ silicon layer (n+ Si film) 106 is formed at a required position on the surface of the amorphous silicon layer 105. A source electrode 107 and a drain electrode 108 respectively having a required pattern are formed on the surface of the n+ silicon layer 106, the side face of the amorphous silicon layer 105, and the surface of the gate insulation film 103.

In addition, as illustrated in FIG. 9, when the polysilicon layer 104 which is the channel region, the source electrode 107 and the drain electrode 108 are projected onto the surface of the glass substrate, a part of each of the source electrode 107 and the drain electrode 108 and a part of the polysilicon layer 104 are overlapped with each other.

Figure 10:
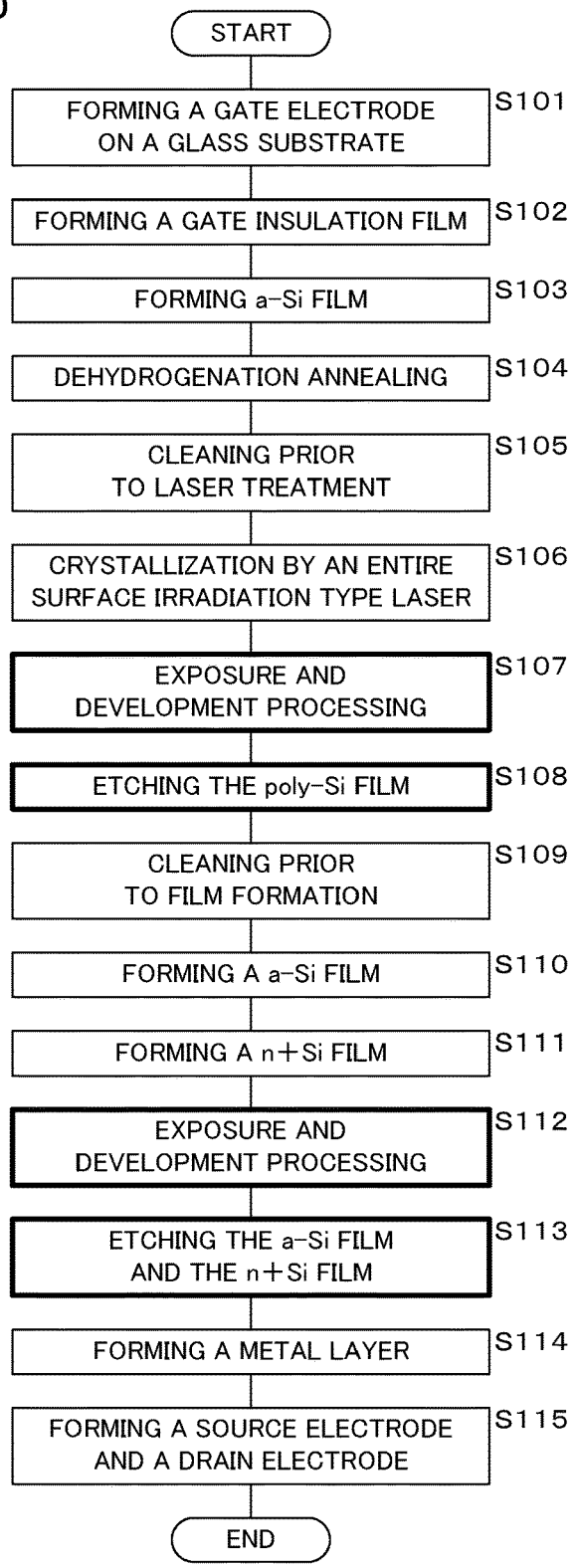
FIG. 10 is a flow chart of manufacturing processes illustrating a method for manufacturing the conventional thin film transistor.

FIG. 10 is a flow chart of manufacturing processes illustrating a method for manufacturing the conventional thin film transistor. As illustrated in FIG. 10, a gate electrode 102 is formed on the glass substrate 101 (S101). At this time, an alignment mark (not illustrated) is formed on metal for a gate electrode. Then, a gate insulation film 103 is formed on the surface of the glass substrate 101 to so as cover the gate electrode 102 (S102).

An a-Si film is formed on the surface of the glass substrate 101 on which the gate insulation film 103 is formed (S103). In order to anneal the a-Si film with laser, dehydrogenation annealing treatment is performed (S104), and cleaning prior to laser treatment is performed (S105).

Next, crystallization of the a-Si film by an entire surface irradiation type laser is performed (S106).

Figure 11:
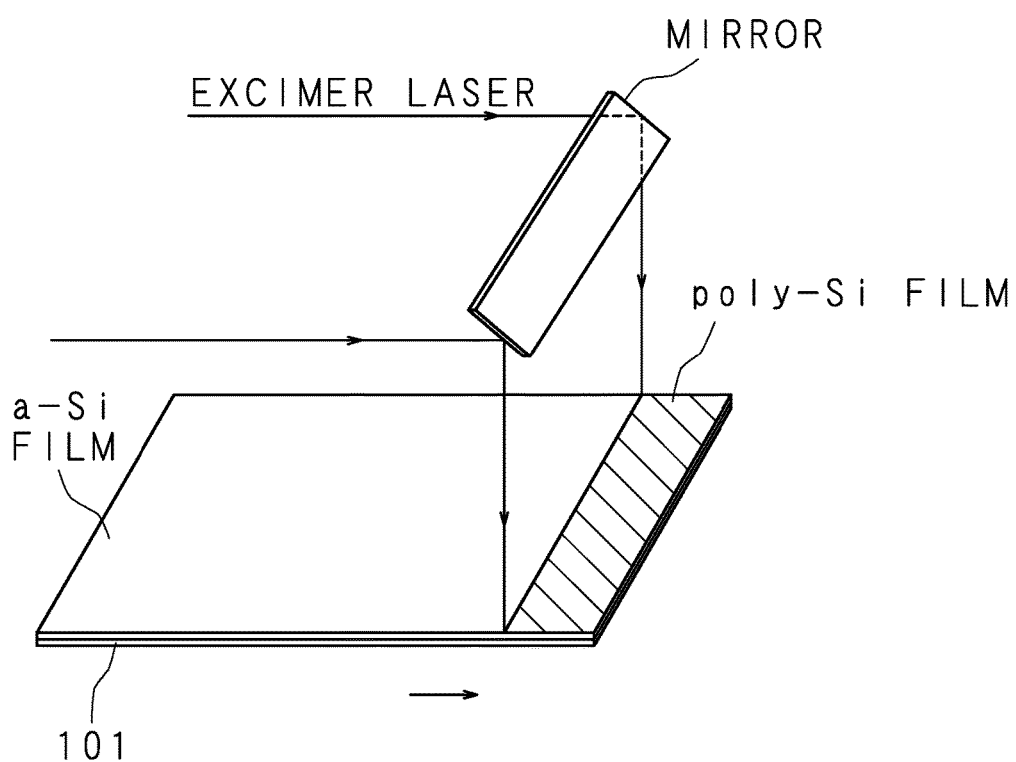
FIG. 11 is a schematic view illustrating an example of a configuration of conventional entire surface irradiation type laser.

FIG. 11 is a schematic view illustrating an example of a configuration of the entire surface irradiation type laser. As illustrated in FIG. 11, the glass substrate 101 having the a-Si film formed on the surface thereof is placed on a mount table (not illustrated), and is moved parallel to a direction shown by an arrow in FIG. 11 at a required speed. A mirror having a length substantially the same as the dimension in a width direction of the glass substrate 101 (direction intersecting the direction of parallel movement) is disposed above the glass substrate 101. A laser beam from a laser light source (not illustrated) enters the mirror, thereby the laser beam is irradiated to the entire surface of the glass substrate 101. As a result, all of the a-Si film is changed to the polysilicon layer (poly-Si film).

Next, exposure and development processings are performed on the polysilicon layer (poly-Si film) formed on the whole of the surface of the glass substrate 101 (S107), and further etching processing is performed thereon in a required shape using the alignment mark (S108). Thereby, a polysilicon layer 104 as the channel region is formed.

Then, cleaning prior to film formation is performed (S109), and an a-Si film 105 is formed so as to cover the polysilicon layer 104 (S110). An n+ Si film (n+ silicon layer) 106 is formed on the surface of the a-Si film 105 (S111).

Next, exposure and development processings are performed (S112), and in order to make the semiconductor layer have a required structure, the a-Si film 105 and the n+ Si film 106 are etched (S113). Then, a metal layer for the source electrode 107 and the drain electrode 108 is formed on the n+ Si film 106 having been etched (S114).

Subsequently, using the alignment mark, the source electrode 107 and the drain electrode 108 are formed by patterning such a metal layer (S115).

As described above, in the method for manufacturing the conventional thin film transistor, based on the alignment mark formed on the metal for the gate electrode, processing of forming the channel region (S108), and processing of forming the source electrode and the drain electrode (S115) have been performed. In addition, in each processing, a misregistration of about 1 to 2 μm commonly occurs during alignment based on the alignment mark. Further, since the formation of the alignment mark is performed in an initial process (process of forming the gate electrode) of the manufacturing method, subsequently, a plurality of layers are formed thereon. Therefore, in the formation processing of the source electrode and the drain electrode, the alignment mark is covered with the plurality of layers, such that it is difficult to recognize the alignment mark.

Furthermore, in the conventional manufacturing method, since two processings are performed using the same alignment mark as a reference, the misregistration is repeated again, that is, a shift of 1 to 4 μm may occur.

On the other hand, in the method for manufacturing the thin film transistor according to the present embodiment illustrated in FIG. 3, in S16, as is conventionally done, processing of forming the channel region by crystallization is performed using the alignment mark.

However, in the processing of forming the source electrode and the drain electrode (S23), the processing is performed using the concave 21 (removed part 20). As described above, since the concave 21 indicates the position of the polysilicon layer 5, and can be clearly recognized, the misregistration does not occur in the processing of forming the source electrode and the drain electrode. Therefore, since a misregistration may occur only in the case of forming the channel region, it is possible to reduce the misregistration in the thin film transistor manufacturing process as a whole.

Further, as illustrated in FIG. 10, in the conventional manufacturing method, after the amorphous silicon layer formed on the whole of the substrate surface is changed to the polysilicon layer by irradiating the entire surface of the substrate with an energy beam (for example, laser), each process of exposure, development and etching processings is performed on the polysilicon layer to form the channel region. Whereas, according to the manufacturing method of the present embodiment, the entire surface of the substrate is not irradiated with the energy beam (for example, laser), but, in the first amorphous silicon layer, only regions to be the channel region are partially irradiated with the energy beam, such that it is possible to form the channel region only by the annealing process. Therefore, each process of exposure, development and etching processings (steps S107 and S108 illustrated in FIG. 10) for forming the channel region is not required, and thereby the manufacturing process may be shortened compared to the conventional manufacturing method.

Furthermore, the thin film transistor of the present embodiment may be used for a display panel. That is, the thin film transistor (TFT substrate) of the present embodiment and a color filter substrate having red (R), green (G) and blue (B) colors are stuck to each other with a required gap, and liquid crystal is injected between the TFT substrate and the color filter substrate, such that a TFT type liquid crystal display panel (liquid crystal display) may be manufactured. Thereby, it is possible to provide a display panel capable of shortening a manufacturing process.

However, in the case of the above-described conventional manufacturing method, it is configured to irradiate the entire surface of the glass substrate with the laser beam. Therefore, for example, for a substrate having a larger size than the sixth generation, there is no laser transmission source that can uniformly irradiate the laser beam, and there is a problem that crystallinities within the substrate surface become different from each other so as to cause unevenness in a characteristic distribution, and thereby resulting in poor quality.

Compared with this, in the case of the present embodiment, it is sufficient to irradiate only the required place on the substrate, not the entire substrate, such that even if the substrate size is increased (for example, in the tenth generation), the problem that the crystallinities of the polysilicon layer become different from each other so as to cause unevenness in the characteristic distribution may be solved. Further, in the laser annealing using the multi-lens array as illustrated in FIG. 4, the line width of the channel region may be more easily controlled than the case of using the conventional exposure, development and etching processes, and the thin film transistor may be easily manufactured.

In addition, in the annealing process according to the present embodiment, the required place is irradiated with an energy beam so that the projected positions, when the source electrode 8, the drain electrode 9 and the channel region are projected onto the surface of the glass substrate 1, are not overlapped with each other. As a result, the leakage current may be further reduced. Further, the second amorphous silicon layer 6 is formed so as to cover the polysilicon layer 5 which is the channel region, and the source electrode 8 and the drain electrode 9 are formed above the second amorphous silicon layer 6 through the n+ silicon layer 7. That is, since the second amorphous silicon layer 6 is provided so as to prevent the source electrode 8 and drain electrode 9 from directly contacting with the channel region, the feature having a further decreased leakage current (leak current) is used.

Figure 12:
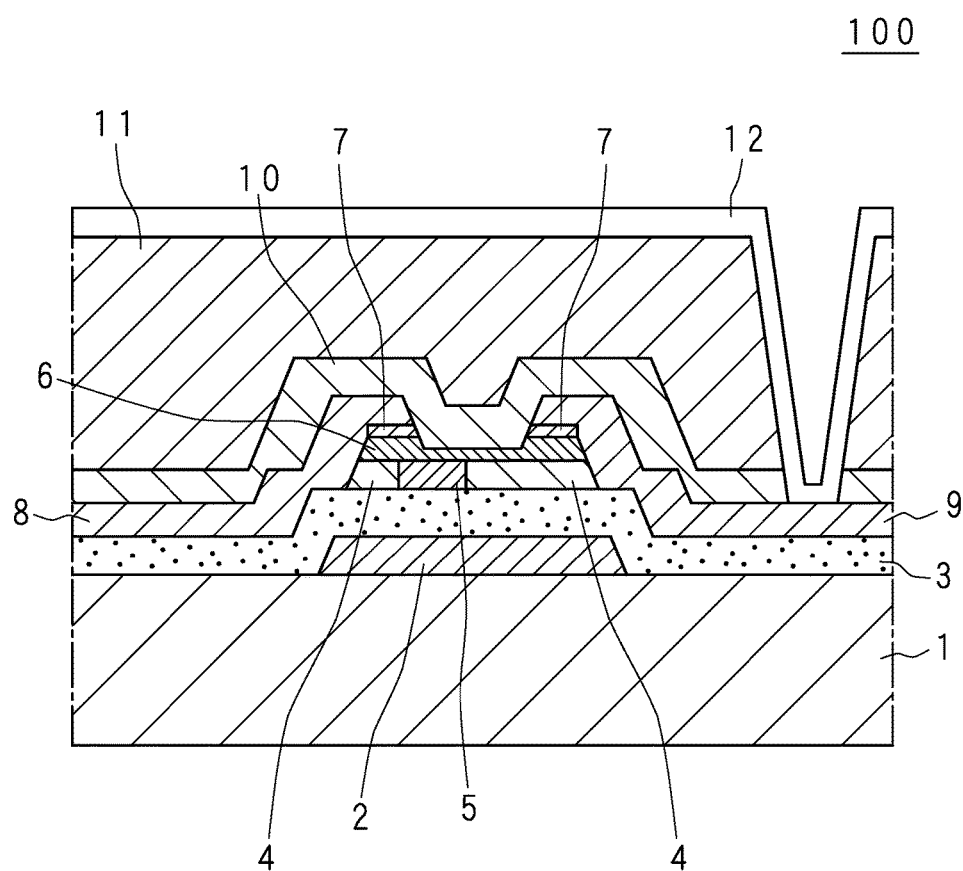
FIG. 12 is a schematic plan view of main components illustrating a second example of the structure of the thin film transistor according to the present embodiment.
Figure 13:
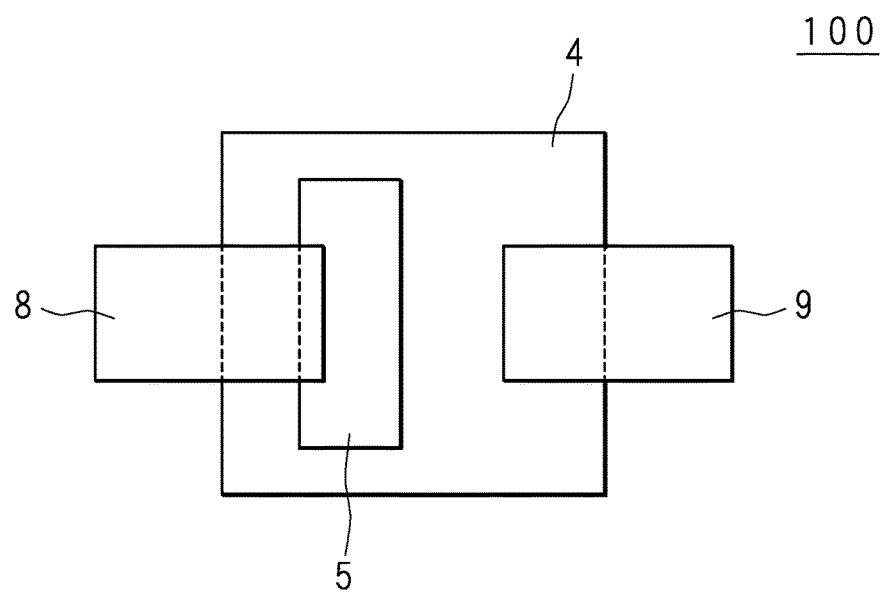
FIG. 13 is a schematic plan view of main components illustrating the second example of the structure of the thin film transistor according to the present embodiment.

FIG. 12 is a schematic cross-sectional view of main components illustrating a second example of the structure of the thin film transistor 100 according to the present embodiment, and FIG. 13 is a schematic plan view of the main components illustrating the second example of the structure of the thin film transistor 100 according to the present embodiment. As illustrated in FIGS. 12 and 13, in the second example, the polysilicon layer 5 as the channel region is located nearer to the source electrode 8 than the case of the first example. That is, as illustrated in FIG. 13, it is configured that projected positions of the drain electrode 9 and the polysilicon layer 5 are not to be overlapped with each other when the drain electrode 9 and the polysilicon layer 5 are projected on the surface of the glass substrate 1. Thereby, it is possible to further reduce the leakage current between the drain electrode 9 and the polysilicon layer 5.

Figure 14:
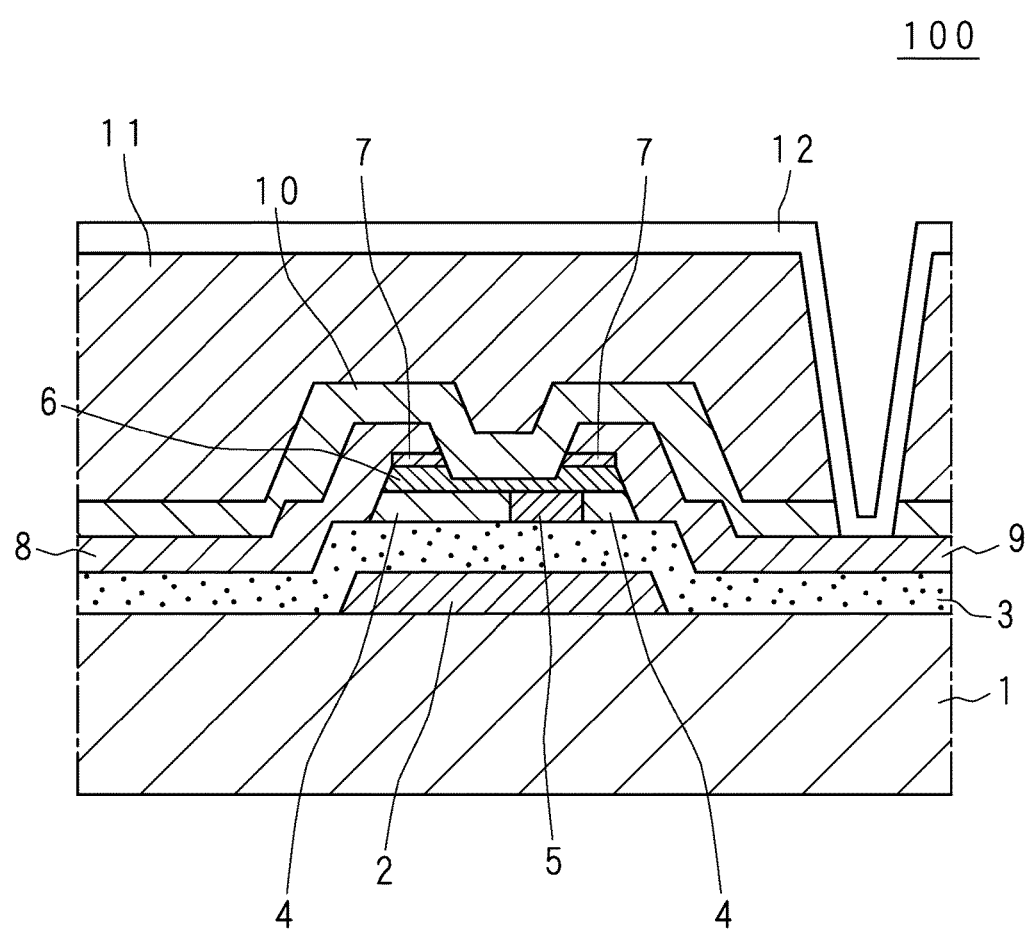
FIG. 14 is a schematic plan view of main components illustrating a third example of the structure of the thin film transistor according to the present embodiment.
Figure 15:
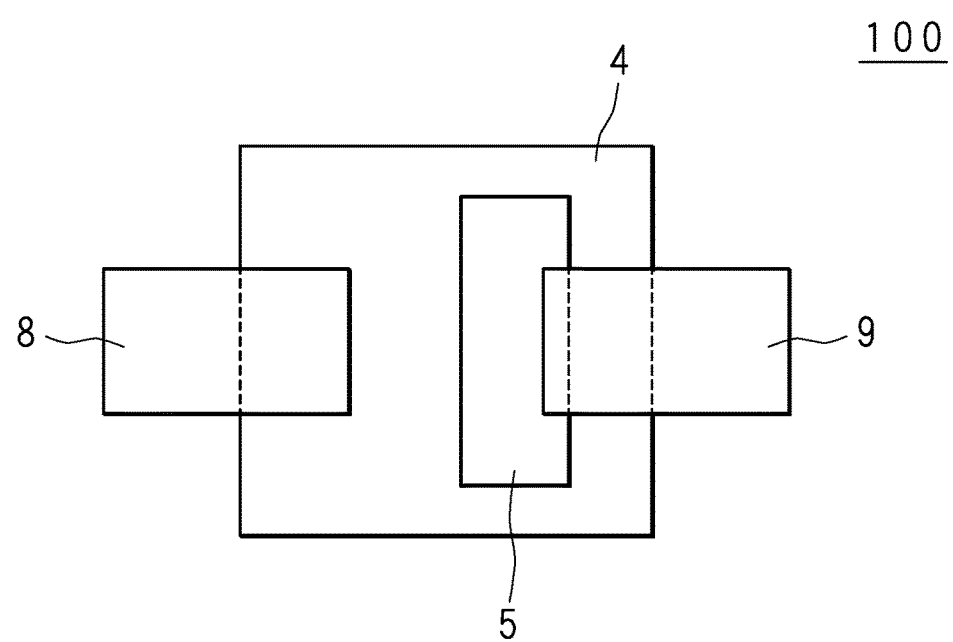
FIG. 15 is a schematic plan view of main components illustrating the third example of the structure of the thin film transistor according to the present embodiment.

FIG. 14 is a schematic cross-sectional view of main components illustrating a third example of the structure of the thin film transistor 100 according to the present embodiment, and FIG. 15 is a schematic plan view of the main components illustrating the third example of the structure of the thin film transistor 100 according to the present embodiment. As illustrated in FIGS. 14 and 15, in the third example, the polysilicon layer 5 as the channel region is located nearer to the drain electrode 9 than the case of the first example. That is, as illustrated in FIG. 15, it is configured that projected positions of the source electrode 8 and the polysilicon layer 5 are not to be overlapped with each other when the source electrode 8 and the polysilicon layer 5 are projected on the surface of the glass substrate 1. Thereby, it is possible to further reduce the leakage current between the source electrode 8 and the polysilicon layer 5.

As described above, it is configured that the projected positions are not to be overlapped with each other when at least one electrode of the source electrode 8 and the drain electrode 9 and the polysilicon layer 5 are projected onto the surface of the glass substrate 1, such that the leakage current may be further reduced.

Figure 16:
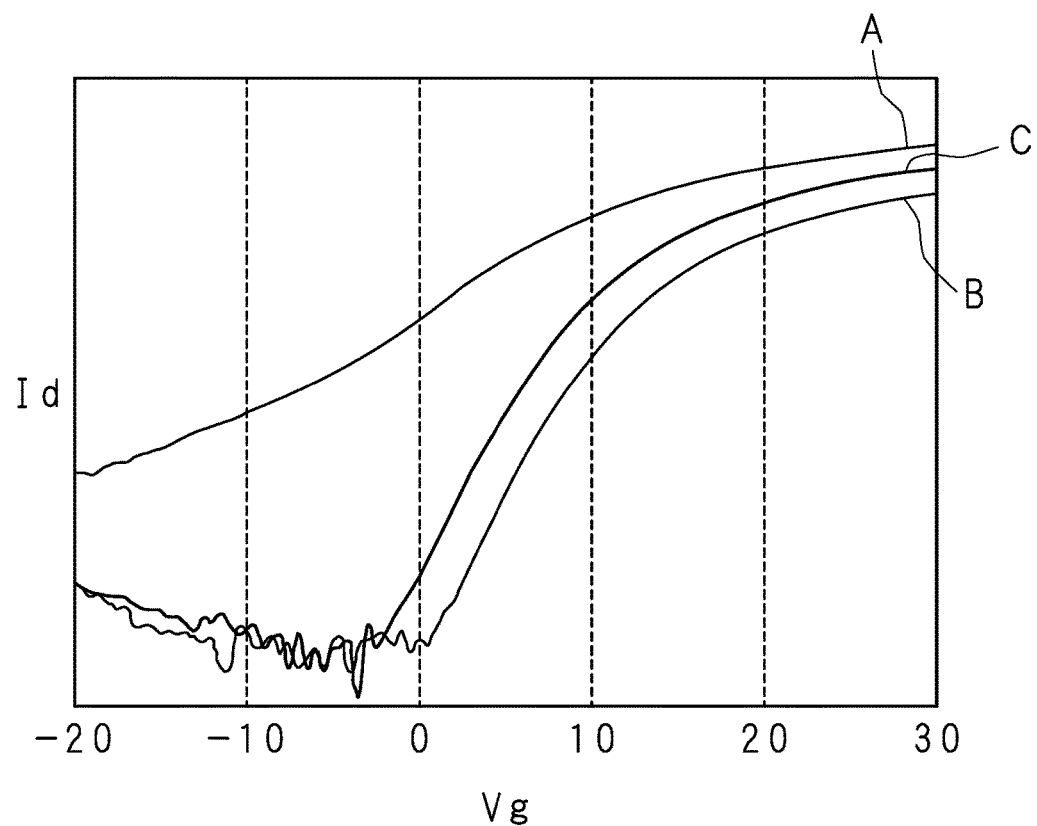
FIG. 16 is an explanatory view illustrating an example of Vg-Id characteristics of the thin film transistor according to the present embodiment.

FIG. 16 is an explanatory view illustrating an example of Vg-Id characteristics of the thin film transistor 100 according to the present embodiment. In FIG. 16, a horizontal axis represents Vg (a gate voltage), and a vertical axis represents Id (a drain current). In addition, a curve illustrated by symbol A in FIG. 16 represents, in a conventional TFT as illustrated in FIGS. 8 and 9, characteristics in a case in which the channel region is the polysilicon layer, and when the source electrode, the drain electrode and the polysilicon layer are projected onto the surface of the glass substrate, a part of each of the source electrode and the drain electrode and a part of the polysilicon layer overlap with each other. A curve illustrated by symbol B in FIG. 16 represents characteristics of the conventional TFT in which the channel region is formed by the amorphous silicon layer. The curve illustrated by symbol C in the drawing represents characteristics in the case of the second example of the present embodiment.

As illustrated in FIG. 16, the TFT (curve of symbol A) having a structure, in which a part of each of the source electrode and the drain electrode and a part of the polysilicon layer are overlapped with each other, may allow the electron mobility of the channel region to be more increased than the TFT (curve of symbol B) in which the channel region is formed by the amorphous silicon layer, such that the drain current in an on-state may be increased, but the leakage current in an off-state is increased.

On the other hand, the TFT (curve of symbol C) of the present embodiment may allow the drain current in the on-state to be more increased than that in the case of the TFT (curve of symbol B) in which the channel region is formed by the amorphous silicon layer, and the leakage current in the off-state may be reduced to be approximately equal to the case of the TFT (curve of symbol B) in which the channel region is formed by the amorphous silicon layer.

It is noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims

The invention claimed is:

1. A method for manufacturing a thin film transistor, comprising the processes of:
    forming a gate electrode on a surface of a substrate;
    forming an insulation film on the surface of the substrate on which the gate electrode is formed;
    forming a first amorphous silicon layer on the surface of the substrate on which the insulation film is formed;
    annealing a channel region in the first amorphous silicon layer by irradiating the channel region with an energy beam to be changed to a polysilicon layer;
    during the annealing process, forming a removed part for an alignment mark in the first amorphous silicon layer with the energy beam;
    forming a second amorphous silicon layer so as to cover the polysilicon layer;
    forming an n+ silicon layer on the second amorphous silicon layer;
    forming a required pattern at the n+ silicon layer;
    etching the first amorphous silicon layer, the second amorphous silicon layer and the n+ silicon layer;
    forming a metal layer on the surface of the substrate after the etching process; and
    forming source electrode and drain electrode by patterning the metal layer based on a position of a concave formed in the metal layer during forming the metal layer due to a presence of the removed part, wherein the annealing process and the removed part forming process are simultaneously performed using a halftone mask having a plurality of transmissive parts with different transmittances from each other.

2. A method for manufacturing a thin film transistor, comprising the processes of:
    forming a gate electrode on a surface of a substrate;
    forming an insulation film on the surface of the substrate on which the gate electrode is formed;
    forming a first amorphous silicon layer on the surface of the substrate on which the insulation film is formed;
    annealing a channel region in the first amorphous silicon layer by irradiating the channel region with an energy beam to be changed to a polysilicon layer;
    during the annealing process, forming a removed part for an alignment mark in the first amorphous silicon layer with the energy beam;
    forming a second amorphous silicon layer so as to cover the polysilicon layer;
    forming an n+ silicon layer on the second amorphous silicon layer;
    forming a required pattern at the n+ silicon layer;
    etching the first amorphous silicon layer, the second amorphous silicon layer and the n+ silicon layer;
    forming a metal layer on the surface of the substrate after the etching process; and
    forming source electrode and drain electrode by patterning the metal layer based on a position of a concave formed in the metal layer during forming the metal layer due to a presence of the removed part, wherein the concave is formed in the vicinity of the channel region, above a gate bus line connected with the gate electrode.

3. A display panel provided with a thin film transistor and an alignment mark used in a patterning of a source electrode and a drain electrode of the thin film transistor, wherein
    the thin film transistor includes:
        a gate electrode formed on a surface of a substrate;
        an insulation film formed on the substrate and on the gate electrode;
        a polysilicon layer formed at a channel region above the gate electrode in a first amorphous silicon layer formed on the insulation film by irradiating the channel region with an energy beam;
        an inside portion of the thin film transistor in the first amorphous silicon layer, which is formed above the gate electrode by etching the first amorphous silicon layer;
        a second amorphous silicon layer formed on the inside portion of the thin film transistor in the first amorphous silicon layer and on the polysilicon layer;
        an n+ silicon layer formed on the second amorphous silicon layer; and
        the source electrode and the drain electrode formed by patterning a metal layer formed on the surface of the substrate after forming of the n+ silicon layer, and
    the display panel includes:
        a removed part formed for an alignment mark in the first amorphous silicon layer by irradiating with the energy beam; and
        a concave formed as the alignment mark in the metal layer due to a presence of the removed part, the metal layer being formed on a portion surrounding the removed part of the first amorphous silicon layer and on the removed part and, wherein the concave is formed in the vicinity of the gate electrode, above a gate bus line connected with the gate electrode.

4. The display panel according to claim 3, wherein the inside portion of the thin film transistor in the first amorphous silicon layer is formed around the polysilicon layer and has a thickness approximately equal to that of the polysilicon layer.

* * * * *